United States Patent [19]
Springthorpe et al.

[11] 4,163,953
[45] Aug. 7, 1979

[54] DOUBLE HETEROSTRUCTURE LASER FOR DIRECT COUPLING TO AN OPTICAL FIBER

[75] Inventors: Anthony J. Springthorpe, Richmond; John C. Dyment, Kanata, both of Canada

[73] Assignee: Northern Telecom Limited, Montreal, Canada

[21] Appl. No.: 813,678

[22] Filed: Jul. 7, 1977

[51] Int. Cl.² ............................................. H01S 3/19
[52] U.S. Cl. .................................. 331/94.5 H; 357/18
[58] Field of Search .................... 331/94.5 H; 357/17, 357/18

[56] References Cited
U.S. PATENT DOCUMENTS

| | | | |
|---|---|---|---|
| 3,981,023 | 9/1976 | King et al. | 357/17 |
| 3,996,492 | 12/1976 | McGroddy | 357/17 X |
| 3,996,528 | 12/1976 | Blum et al. | 331/94.5 H |
| 4,136,928 | 1/1979 | Logan et al. | 331/94.5 H X |

*Primary Examiner*—James W. Davie
*Attorney, Agent, or Firm*—Sidney T. Jelly

[57] ABSTRACT

A double heterostructure laser has a first confining layer on the substrate, an active layer on the first confining layer and a second confining layer on the active layer. A groove is etched through the second confining layer and active layer to form a reflecting surface at approximately 45° to the plane of the active layer. The resonant cavity is formed between a cleaned end surface and a surface at the substrate. A hole through the substrate to the first confining layer is aligned with the reflecting surface for emission therethrough.

7 Claims, 13 Drawing Figures

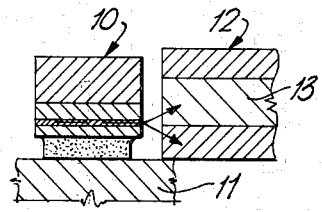
(PRIOR ART)
Fig-1-
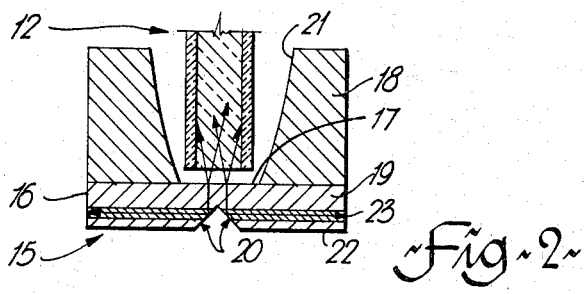
Fig-2-
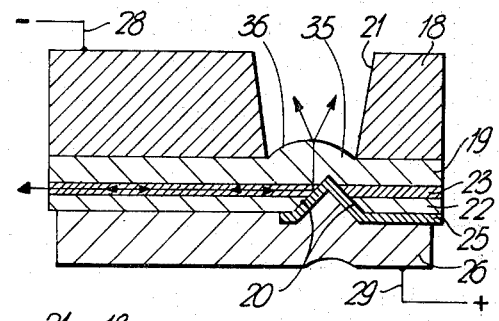
Fig-4-
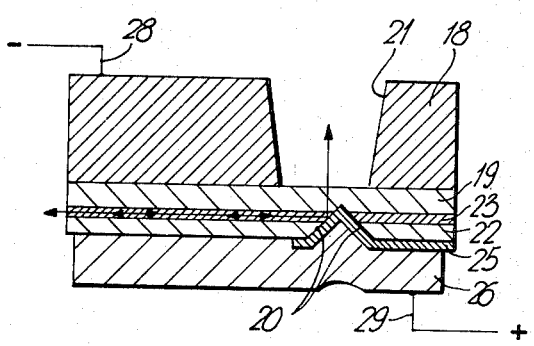
Fig-3-

DOUBLE HETEROSTRUCTURE LASER FOR DIRECT COUPLING TO AN OPTICAL FIBER

This invention relates to lasers, and in particular to double heterostructure lasers, for direct coupling to an optical fiber.

Conventional stripe geometry CW lasers cannot readily be butted directly to optical fibers because the light emitting stripe is not at a convenient distance from the heat sink. Thus, typically, the light emitting stripe is about 10–12 μm away from the heat sink. The axis of the fiber mounted on the heat sink would be at a greater distance than this and therefore coupling is not effective. Coupling can be achieved by mounting the laser on a raised heat sink, with suitable lensing between laser and the core of the fiber, but this is complex and expensive.

U.S. Pat. Nos. 3,996,492 and 3,996,528, both issued on Dec. 7, 1976, disclose folded cavity lasers in which the lasing light is reflected twice by mirror surfaces etched into the p-n junction. In U.S. Pat. No. 3,996,492, a full mirror surface is formed on the back surface of a substrate at one position, aligned with one of the mirror surfaces, and a partially transmissive mirror is formed on the back surface of the substrate and aligned with the other mirror surface. The laser cavity extends from the full mirror up to the first mirror surface across to the other mirror surface and down to the partially transmissive mirror. Thus the lasing light is turned twice. In U.S. Pat. No. 3,996,528 light can issue at two spaced apart positions on the back surface of the substrate as partially transmissive mirrors are formed at both positions, substantially aligned with each mirror surface. A diffraction grating is formed at each partially transmitting mirror.

The present invention provides a new structure for a laser. In the present invention the resonant cavity of the laser is formed between an end surface of the active layer and a surface associated with the substrate surface, the associated surface being generally parallel to the active layer, with rotation of the laser beam through about 90° by means of a mirror at about 45° to the substrate surface.

The invention will be readily understood by the following description of certain embodiments, by way of example, in conjunction with the accompanying diagrammatic drawings, in which:

FIG. 1 is a cross-section through a conventional stripe laser and an optical fiber, illustrating coupling difficulties;

FIG. 2 is a cross-section through one form of device in accordance with the present invention, illustrating the basic principle of the invention;

FIG. 3 is a cross-section similar to that of FIG. 2, illustrating a typical structure for a device as in FIG. 2;

FIG. 4 illustrates a modification of the structure of FIG. 2;

Figure 5:
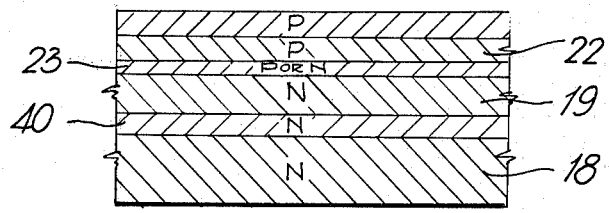
FIGS. 5 to 13 illustrate the various steps in the production of a device in accordance with the present invention.

In FIG. 1, a conventional laser chip 10 is mounted on a heat sink 11. An optical fiber 12 is shown butted to the laser chip and it will be seen that coupling is ineffective in that little of the light emitted from the laser enters the fiber core 13.

The broad general principle of the present invention is illustrated in FIG. 2. This is basically a "Burrus" type light emitting diode structure 15 modified to form the laser cavity between the natural (110) cleavage face 16 and the interface 17 between the substrate 18 and first confining layer 19. Rotation of the beam is performed by a mirror 20 at 45° to the substrate surface, or interface 17. Coupling of an optical fiber is readily accomplished by inserting the fiber 12 in a hole 21 etched through the substrate 18. The mirror 20 is formed by, for example, etching through second confining layer 22 and active layer 23, to the first confining layer 19.

The device as illustrated in FIG. 2 relies on the natural (110) cleavage face 16 for one of the reflecting surfaces of the laser. If the emission from this face is observed then it will appear as a conventional CW stripe laser. To utilize the energy that would be lost through this face a totally reflecting coating is applied to ensure that all the available energy exits via the interface 17.

For efficient operation, two basic requirements exist, (a) the interface between substrate and first confining layer should be perfectly plane, and (b) the mirror should be at 45°. However, as will be described, it is possible to accommodate, and provide for, some slight departures from such requirements. Producing the mirrors is possible by various methods. Etching can be used, although this can create problems due to the lack of a natural etching plane at 45° to the (100) surface of the substrate. Ion milling is another technique.

FIG. 3 illustrates one particular structure for a device as in FIG. 2. On n-type GaAs substrate 18 is formed the first confining layer 19 of n-type $Ga_{1-x}Al_xAs$, followed by active layer 23 of n or p type $Ga_{1-y}Al_yAs$, suitably doped to produce a p-n layer at one of the two surfaces of the active layer, ($y < < x$). Second confining layer 22 is of p-type $Ga_{1-x}Al_xAs$. The mirror 20 is formed, as by etching, and deposition of a layer of $SiO_2$ 25. A heat sink layer 26 typically of gold is formed over the second confining layer and the $SiO_2$ layer.

The two confining layers 19 and 22 and active layer 23 are conveniently formed by conventional epitaxial growth on the substrate 18. The $SiO_2$ layer is deposited, either through a mask, or by photolithographically etching. The gold heat sink is formed by plating in a conventional manner. The hole 21 is etched through the substrate after masking of the substrate. Electrical contact is made to the substrate and to the gold layer with the substrate negatively biased to the gold layer, as indicated at 28 and 29.

As previously stated, the interface between substrate and first confining layer should be perfectly plane. Generally, with present day techniques, the surface of the substrate on which is produced the first confining layer is usually satisfactorily smooth and flat by normal production processes. It is usually possible to produce a suitable surface on the substrate by mechanical polishing, the confining layer being formed on the polished surface. However, if the surface is rough it is possible to grow a thin layer of n-GaAs on the substrate. This layer grows to give a flat, smooth surface.

While the mirrors should be at 45° to substrate surface some departure can be accommodated. It is possible to provide some correction at, for example, the interface between substrate and confining surface.

The essential feature is that a resonant cavity or laser path be provided. While, for convenience, one reflecting surface of the cavity or path is made the interface between substrate and first confining layer, this is not essential, and the reflecting surface can be positioned from the substrate surface, as for example, by an intervening layer between substrate and confining layer.

It is also possible to modify the emitting surface to improve emission efficiency and output. Thus the emitting surface can be in the form of a lens structure. FIG. 4 illustrates a modification of the structure of FIG. 3 in which a lens formation 35 is formed at the base of the hole 21. The lens formation may be made integral with the first confining layer 19, or as a separate entity positioned in the base of the hole before positioning a fiber therein. The profile of the lens surface 36 will depend upon circumstances. Thus if the lens is integral with the first confining layer then the surface 36 will become the reflecting surface for the laser path. The profile will then need to be such that light rays reflected back from the surface 36 will be reflected correctly by the mirror 20. It is possible also to provide a grating structure either at the flat emission surface of FIG. 3 or on the lens surface of FIG. 4. A grating applied to the lens surface will give wavelength and mode control.

A particular method of preparing 45° mirror lasers by chemical etching is as follows. The method is valid for the crystallographic orientation specified and would need modifying for other orientations. An alternative method of ion milling would generally be applicable for all orientations.

A polished (100) orientation GaAs substrate slice with (110) cleaved sides, has a 3 (or 4) layer double heterostructure grown on the surface in a conventional manner resulting in a structure as in FIG. 5. The important layers are the $N-Ga_{1-x}Al_xAs$ and $p-Ga_{1-x}Al_xAs$ confining layers 19 and 22 and the sandwiched p- or $n-Ga_{1-y}Al_yAs$ active layer 23. In general $x \geq 0.20$ (0.40 preferred), $y=0-0.1$ $(x-y \geq 0.1)$, and the active layer can be p-type, n-type or undoped. Additionally a buffer layer 40 of n-GaAs can be grown before growing the n-GaAlAs layer 19 to help eliminate problems associated with surface damage in the substrate (caused by polishing and pre-growth thermal etching). This also ensures that the interface between substrate 18 and the N-GaAlAs confining layer 19 is planar, which is not always the case when growing directly into the substrate. Also a layer 41 of p-GaAs can be grown on top of the p-GaAlAs confining layer 22 which assists in making low resistance ohmic contacts. These extra layers of n-GaAs and p-GaAs do not affect the basic physics of the device and will not be referred to in the remainder of this description.

Figure 6:
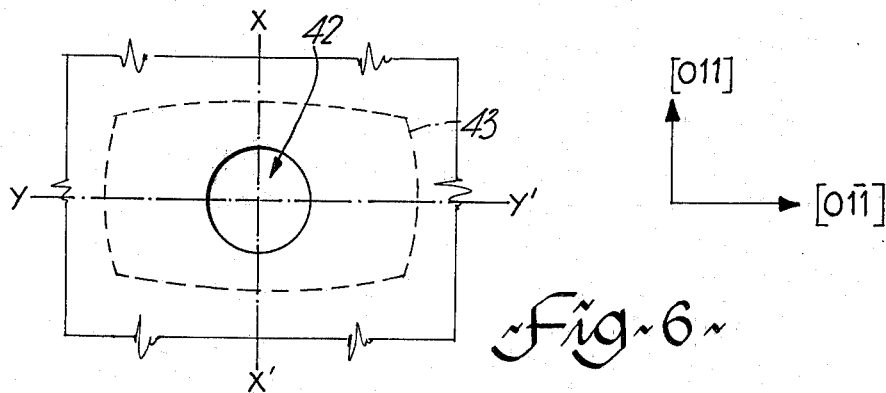

Following the epitaxial growth of the various layers the slices are cleaned and coated with a layer of insulating dielectric, e.g., chemically-vapour deposited silicon dioxide. (1000-2000 Å is suitable). In order to form the reflecting mirror in the right direction it is necessary to identify the different [110] cleavage directions. This can be accomplished by etching a pin-hole 42 (1-2 mil diameter) in the oxide using suitable masking techniques. A selective etch, such a 1% $Br_2$ in $Ch_3OH$, applied for ~60 secs. will attack the surface and yield a characteristically shaped pit as shown by dotted outline 43 in FIG. 6.

Figure 7:
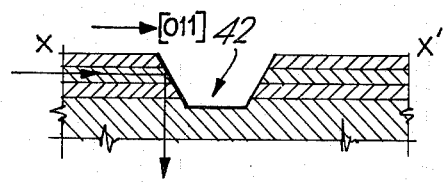
Figure 8:
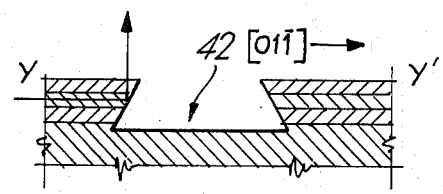

The long axis of the pit is an (01$\bar{1}$) direction as in FIG. 8. From the cross-sections of the etch pit, FIGS. 7 and 8, it can be seen that in order to obtain the 45° mirror so that it reflects the light towards the substrate, the laser must be aligned in the (011) direction. If however the laser is aligned along the (01$\bar{1}$) direction then the light will be reflected upwards, through the p-GaAlAs layer.

Figures 9, 10:
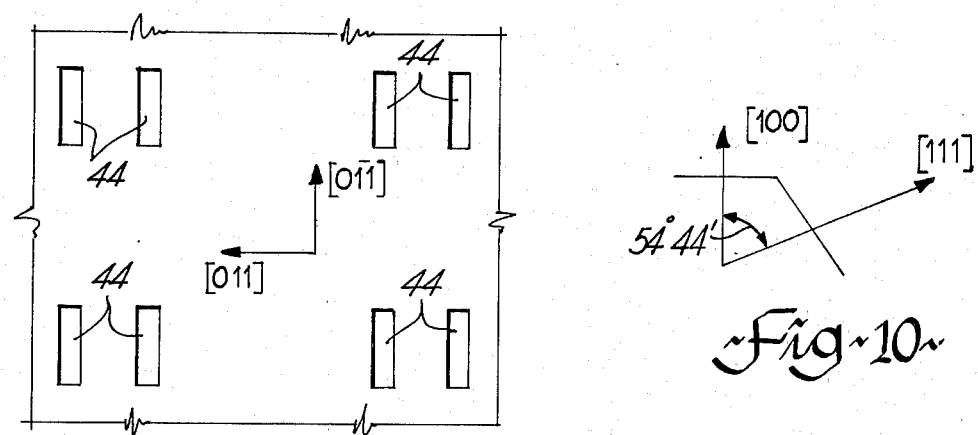

Having established the correct desired direction, in the present example [011], for alignment of the laser stripe, the 45° mirrors can now be etched. Pairs of rectangular slots 44 75 μm long × 12.5 μm wide separated by 500 μm and repeated on 1250 μm centers in X and 500 μm in Y are opened in the oxide using conventional masking and etching techniques. The long axis of the slot is in [01$\bar{1}$], as illustrated in FIG. 9.

The slots are then etched out using a preferential etch such as $1H_2O_2:1H_3PO_4:6CH_3OH$ to a depth greater than the active layer. At 18° C. this etch attacks GaAs and GaAlAs at ~0.5 μm/min. so that a total etch depth of 3 μm can be readily controlled. This etch, and most other preferential etches, eventually expose (111) planes which are the walls of the trough that is formed. Although the angle between (111) and (100) is 54°44', FIG. 10, for shallow etch depths it has been found that the angle is closer to 45°, i.e., the (111) plane is not fully developed and the exposed face can be used as a reflecting mirror.

Figure 11:
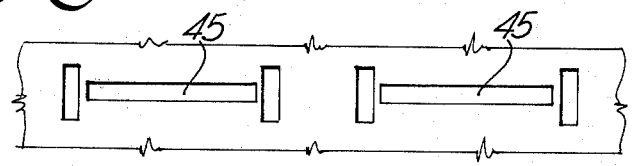

Following the mirror etching step the slices are cleaned and then recoated with oxide so that the holes are completely coated, insulating the exposed p-n junction. A laser stripe 45 is then etched in the oxide with the stripe aligned along [011], as illustrated in FIG. 11. The stripe is discontinuous and does not overlap the mirror slots. The surface of the crystal, exposed in the stripe, is then zinc-diffused to form a thin (~0.2 μm) conducting layer; e.g. $ZnAs_2$ source, at 600° C. for 15 mins. in a semi-sealed tube.

Figure 12:
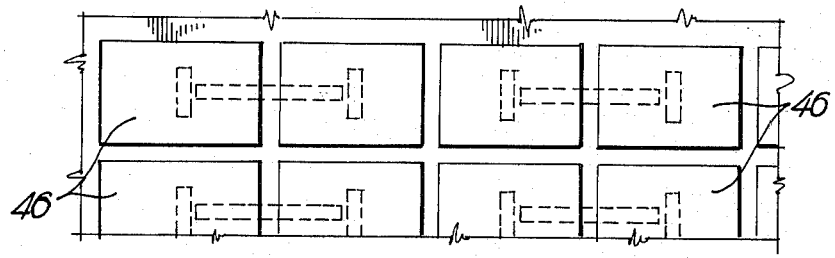

After diffusion the striped surface is metallized with 200 Å chromium followed by 2000 Å of gold. Gold heat sinks and then applied to the metallized surface using photolithographic techniques and electroplating from solution to a thickness of ~10 μm. A typical heat sink pattern is illustrated in FIG. 12, the heat sinks indicated at 46. The slice is then reduced in thickness on the n-side (opposite from the heat sinks) by lapping, polishing and etching to ~100 μm. The n-surface is metallized with 200 Å of gold/germanium eutectic followed by 4000 Å of gold. 175 μm diameter windows are opened in the n-side metallization, (aligned with the mirror slots on the p-surface) using $KI-I_2$ etch. Following this the slice is heat treated at 440° C. for 2 minutes to allow the n-side contact. The holes in the n-side can then be etched out, using alkaline peroxide etch in a recirculatory etcher, down to the interface between GaAs and N-GaAlAs, where etching stops. A typical process using an alkaline peroxide selective etch is described in U.S. Pat. No. 4,086,126, issued Apr. 25, 1978. Other etchants can be used.

Figure 13:
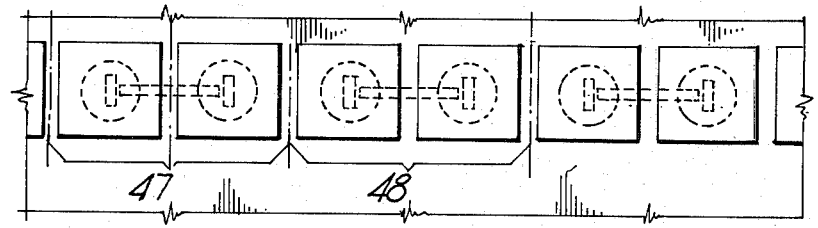

The slice can then be cleaved into chips as indicated in FIG. 13, to yield two kinds of etched lasers; either along lines indicated at 47 for single lasers, or along lines 48 for double lasers.

What is claimed is:

1. A laser having a semiconductor substrate and a double heterostructure on a surface of said substrate, said structure comprising; a first confining layer of semiconductor material on said surface of said substrate, an active layer of semiconductor material on said first confining layer and a second confining layer on said active layer, said first confining layer being of the same conductivity type as said substrate; said second confining layer being of the opposite conductivity type as said first confining layer and said active layer being of the same conductivity type as one of said confining layers to form a p-n junction between said active layer and one of said confining layers; a cleaved end surface on said structure, said end surface extending normal to the plane of said active layer; a reflecting surface extending through said second confining layer and said active layer and inclined relative to the plane of said active layer to form a resonant cavity between said end surface and a further surface at said substrate surface; a hole through said substrate to said first confining layer, said hole aligned with said reflecting surface for emission of light therethrough; and electrical contact means for applying a forward bias to said active layer.

2. A laser as claimed in claim 1, said resonant cavity extending between said end surface of said active layer and the surface of said first confining layer contiguous with said substrate.

3. A laser as claimed in claim 1, said reflecting surface inclined at approximately 45° to said plane of said active layer.

4. A laser as claimed in claim 1, including a lens structure on said further surface at said substrate surface.

5. A laser as claimed in claim 1, said substrate of GaAs, said active layer and confining layers of GaAlAs.

6. A laser as claimed in claim 1, including a Vee shaped groove etched through said second confining layer and said active layer, and a layer of $SiO_2$ on one of the surfaces of said V-shaped groove to form said reflecting surface.

7. A laser as claimed in claim 1, including a heat sink layer on said second confining layer.

* * * * *